(12) United States Patent
Gardner et al.

(10) Patent No.: US 6,255,698 B1
(45) Date of Patent: Jul. 3, 2001

(54) SEPARATELY OPTIMIZED GATE STRUCTURES FOR N-CHANNEL AND P-CHANNEL TRANSISTORS IN AN INTEGRATED CIRCUIT

(75) Inventors: Mark I. Gardner, Cedar Creek; H. Jim Fulford, Jr., Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/301,263

(22) Filed: Apr. 28, 1999

(51) Int. Cl.⁷ .................................................. H01L 29/76
(52) U.S. Cl. .................. 257/369; 257/371; 257/374; 257/409; 257/410; 257/412
(58) Field of Search ..................... 257/368, 369, 257/371, 374, 388, 409, 410, 411, 412

(56) References Cited

U.S. PATENT DOCUMENTS

| | | | |
|---|---|---|---|
| 5,391,510 | 2/1995 | Hsu et al. | 438/301 |
| 5,567,642 | * 10/1996 | Kim et al. | 257/371 |
| 5,970,331 | * 10/1999 | Gardner et al. | 257/369 |
| 5,981,320 | * 11/1999 | Lee | 257/369 |

* cited by examiner

*Primary Examiner*—Minh Loan Tran
(74) *Attorney, Agent, or Firm*—Kevin L. Daffer; Conley, Rose & Tayon P.C.

(57) ABSTRACT

An integrated circuit containing separately optimized gate structures for n-channel and p-channel transistors is provided and formed. Original gate structures for both n-channel and p-channel transistors are patterned over appropriately-doped active regions of a semiconductor substrate. Protective dielectrics are formed over the semiconductor substrate to the same elevation level as the upper surfaces of the original gate structures, so that only the upper surfaces of the gate structures are exposed. A masking layer is used to cover the gate structures of either the p-channel or the n-channel transistors. The uncovered gate structures are removed, forming a trench within the protective dielectric in place of each removed gate structure. The trenches are refilled with a new gate structure which is preferably optimized for operation of the appropriate transistor type (n-channel or p-channel).

18 Claims, 6 Drawing Sheets

SEPARATELY OPTIMIZED GATE STRUCTURES FOR N-CHANNEL AND P-CHANNEL TRANSISTORS IN AN INTEGRATED CIRCUIT

BACKGROUND OF THE INVENTION

1. Field of the Invention

This invention relates to integrated circuit fabrication, and more particularly, to an integrated circuit in which gate structures for n-channel and p-channel transistors are separately optimized, and to a method for producing this integrated circuit.

2. Description of the Relevant Art

Metal-oxide-semiconductor field effect transistors (MOSFETs) are a fundamental building block of most modern integrated circuits. Fabrication of a MOSFET involves numerous processing steps. A gate dielectric, typically formed from silicon dioxide ("oxide"), is formed on a portion of semiconductor substrate which is doped with either n-type or p-type impurities. A gate conductor is formed over the gate dielectric, and dopant impurities are introduced into the substrate to form a source and drain. The channel of the transistor is located under the gate dielectric, between the source and drain.

Two basic types of MOSFET may be formed: n-channel MOSFETs or p-channel MOSFETs. In an n-channel MOSFET, the portion of the substrate which forms the channel is doped p-type, and the source and drain regions are doped n-type. In a p-channel MOSFET, on the other hand, the reverse is true: p-type source and drain regions are formed in an n-type region of the substrate. Integrated circuits may be made using exclusively n-channel transistors (NMOS technology) or exclusively p-channel transistors (PMOS technology). However, several advantages may be associated with combining n-channel and p-channel transistors within a circuit. Complementary MOS (CMOS) technology, in which each logic gate in the circuit contains both an n-channel and a p-channel transistor, is very widely used in current integrated circuit manufacture. A major advantage of CMOS technology is that power consumption of the resulting circuitry is reduced by comparison to NMOS or PMOS technology. CMOS thereby allows a higher density of transistors to be used in an integrated circuit without incurring power dissipation and circuit heating problems.

The high transistor density which may be used makes CMOS technology particularly suitable in light of the trend in modern integrated circuit manufacture toward production of transistors having feature sizes as small as possible. Many modern day processes employ features, such as gate conductors and interconnects, which have less than 0.3 $\mu$m critical dimension. As feature size decreases, the sizes of the resulting transistors and the interconnect between transistors also decrease. Fabrication of smaller transistors allows more transistors to be placed on a single monolithic substrate, thereby allowing relatively large circuit systems to be incorporated on a single, relatively small die area.

CMOS circuits are typically formed by establishing both n-type and p-type active regions within a semiconductor substrate. The active regions may be separated by isolation regions formed within the substrate. A gate dielectric layer and a gate conductor layer, typically polysilicon, are typically formed over all of the active regions simultaneously. These layers are then patterned to form a gate structure, including a gate dielectric and gate conductor, over each active region. Fabrication of the gate structures before formation of the source and drain regions of the transistors is important to the realization of "self-aligned" transistor structures. The source and drain regions formed in self-aligned structures exhibit minimal overlap with the transistor gate, minimizing the parasitic capacitances that limit high-frequency transistor performance. In general, the self-alignment is achieved by fabricating a gate conductor, and subsequently using the gate conductor as a mask for implantation of dopant impurities to form the source and drain. Because it is formed before the implantation and subsequent annealing of the source and drain impurities, the gate conductor is made from a material which can withstand high-temperature processing.

Much of the transistor fabrication occurring subsequent to the gate structure formation is done separately for n-channel and p-channel transistors. Photoresist masking of, for example, the p-type active regions may be done during formation of source and drain regions for the p-channel transistors fabricated on the n-type active regions. Similarly, source and drain regions for the n-channel transistors may be formed while the n-type active regions are protected by photoresist. Other attributes which may be different for n-channel and p-channel transistors in a circuit include the doping of the polysilicon gate conductor. While in some fabrication processes gate conductors for both n-channel and p-channel devices are made from n-type polysilicon, some processes use n-type polysilicon gate conductors for n-channel transistors, and p-type polysilicon gate conductors for p-channel transistors.

Although some aspects of CMOS fabrication are different for n-channel and p-channel transistors, as noted above, one attribute which is typically the same for both the n-channel and p-channel transistors is the basic composition of the gate structure. "Composition of the gate structure" is used herein to refer to both the materials used to form the gate structure and the layer thicknesses of those materials. For example, in a conventional CMOS circuit, gate dielectrics are typically formed from oxide for both n-channel and p-channel transistors, while gate conductors are formed from polysilicon (the polysilicon gate conductors may have opposite doping types, as described above). Furthermore, since gate structures for both the n-channel and p-channel transistors are generally patterned from a common dielectric/polysilicon stack, the n-channel and p-channel gate structures typically have the same gate dielectric thicknesses and the same gate conductor thicknesses.

There are disadvantages to having the same composition of the n-channel and p-channel gate structures, however. In particular, problems may arise from the different dopants used to form the source/drain regions in n-channel and p-channel devices. The boron used to form source and drain regions in p-channel transistors is known to diffuse significantly faster than the n-type dopants, such as arsenic and phosphorus, typically used in n-channel transistors. This rapid boron diffusion can have various consequences for p-channel transistors. For example, diffusion of source and drain impurities into the channel can shorten the effective length of the channel. The gate lengths, or nominal channel lengths, of p-channel transistors can therefore not be reduced to the extent that they can for n-channel transistors. Boron may also diffuse across the gate dielectric in a p-channel transistor, either from the polysilicon gate conductor into the channel (when p-type polysilicon is used for the gate), and/or from source/drain portions underlying the gate conductor (due to lateral diffusion) up into the polysilicon gate conductor. In either case, such diffusion across the gate dielectric can alter the threshold voltage of the transistor, by changing the work function of the polysilicon gate and/or by changing the channel doping. The gate dielectrics of p-channel transistors should therefore not be made too thin, and diffusion barrier layers associated with either the gate dielectric or the gate conductor may be desirable.

The limitations described above for p-channel transistors are generally much less relevant to n-channel transistors, and in fact pose a problem for getting optimum performance from n-channel transistors. To the extent possible, it is desirable to reduce transistor feature sizes, as discussed above. It would therefore be desirable to reduce the gate length of the n-channel transistors, which do not employ boron-doped source and drain regions. The feature size reduction discussed above necessitates a reduction of overall transistor dimensions and operating voltages known as "scaling". As gate lengths decrease, for example, other device dimensions must also decrease in order to maintain proper device operation. These device dimensions and voltages are not necessarily each decreased by the same factor. One dimension which is generally decreased when gate lengths are decreased, however, is gate dielectric thickness. Gate dielectric thickness for n-channel transistors should therefore be reduced if n-channel transistors having reduced gate length are to be fabricated.

An optimized n-channel transistor structure having a shortened gate length and thinner gate dielectric as discussed above is in conflict with the requirements of an optimized p-channel transistor having a thicker gate oxide and possibly a diffusion barrier in the gate structure, because the gate structure composition is the same for n-channel and p-channel transistors in a conventional circuit. It would therefore be desirable to develop a method for forming separate gate structures for n-channel and p-channel transistors. The method should allow self-aligned n-channel and p-channel transistors to be fabricated.

SUMMARY OF THE INVENTION

The problems outlined above are in large part addressed by employing a process in which the original n-channel and/or p-channel gate structures are removed and replaced by new gate structures. Original gate structures for at least one n-channel and at least one p-channel transistor are formed over p-type and n-type active regions of a semiconductor substrate, respectively. The gate structures are patterned from a gate conductor layer formed over a gate dielectric layer, such that each gate structure includes a gate conductor over a gate dielectric. Further self-aligned transistor fabrication may be performed using these original gate structures, such as introduction of shallow source and drain impurities using a gate structure as a mask. Dielectric spacers may also be formed on sidewalls of these gate structures, and deep source/drain impurity distributions may be introduced self-aligned to lateral surfaces of the dielectric spacers.

Protective dielectrics are formed over the substrate and surrounding the gate structures such that upper surfaces of the dielectrics may be somewhat even with upper surfaces of the transistor gate conductors. In this way, all upper surfaces of the transistors except the upper surfaces of the gate conductors are protected by dielectric. Gate structures for either the n-channel or p-channel transistors are subsequently covered by a masking layer, so that subsequent processing affects only uncovered gate conductors. The choice of which type of transistor to cover depends on the particular transistor structures desired. In one embodiment of the method recited herein, for example, the original gate structures are optimized for p-channel transistor performance. In this embodiment, the p-channel transistors are covered by the masking layer, so that these transistors are protected from subsequent processing.

Each uncovered gate structure is subsequently removed by an etch process which is selective to the protective dielectrics, the dielectric sidewall spacers (if present) and the semiconductor substrate. In this way, a trench is formed, having dielectric sidewalls and bounded on the bottom by the upper surface of the semiconductor substrate. A new gate structure is then formed within the trench by deposition of a new gate dielectric and gate conductor. The new gate structure may be optimized for operation of the corresponding transistor type. For example, if the original gate structure is optimized for p-channel transistor performance, and the original gate structures corresponding to the n-channel transistors are subsequently removed, the new gate structure may be optimized for n-channel transistor performance. This may be done, for example, by forming a thinner gate dielectric in the new gate structure than in the original gate structure. A different dielectric material could also be used, such as a high-permittivity material. Silicide contacts formed on polysilicon gate conductors are known to exhibit increased resistivity when gate lengths become very short. Rather than a polysilicon gate conductor, a metal gate conductor which provides a low resistivity may be formed as part of the new gate structure in order to avoid geometry-dependent silicide resistivity. In embodiments for which source and drain regions are formed using the original gate structures, elevated temperatures may be unnecessary subsequent to formation of the new gate structures. In this case, low-temperature, low-resistivity metals such as copper or aluminum may be used in the new gate structures.

The dielectrics or sidewall spacers formed adjacent to the original gate structures serve to define the dimensions of the new gate structures formed after the original gate structures for one type of transistor are removed. In this manner, although the new gate structure may be formed after the source and drain regions of the corresponding transistor, it is self-aligned to them nonetheless. The separate gate structure fabrication for n-channel and p-channel transistors recited herein may result in improved performance of circuits containing both n-channel and p-channel transistors, such as CMOS or BiCMOS circuits. This improved performance is believed to result from optimization of the performance of both the n-channel and p-channel transistors.

After formation of the new gate structures, the masking layer covering the remaining original gate structures is removed. In some embodiments, a masking layer is formed over the new gate structures such that the remaining original gate structures are exposed. Upper portions of the original gate structures, such as the gate conductors, may then be removed using a selective etch process. The resulting trenches may be refilled with new gate structure portions, such as new gate conductors. This procedure may be useful, for example, in embodiments for which low-resistance metal gates are desired for both n-channel and p-channel transistors in a circuit.

The flexibility in gate structure design provided by the method recited herein may be helpful in balancing the magnitudes of the threshold voltages of the n-channel and p-channel devices. For CMOS circuits, threshold voltages of n-channel and p-channel devices are preferably of opposite sign (positive for n-channel, negative for p-channel), and of approximately the same magnitude. Threshold voltages are conventionally adjusted using ion implantation into the channel region of a transistor. As transistor feature sizes are reduced, however, this threshold adjust implantation may undesirably interact with other doping adjustments near the transistor channel. For example, an increased substrate doping at a depth near the junction depth of the source/drain regions is often used to counteract a short-channel effect called "punchthrough". Punchthrough refers to a joining under the transistor channel of depletion regions associated with the source/channel junction and the drain/channel junction, and can result in a loss of the gate-controlled operation of the transistor. Because the transistor scaling associated with feature size reduction includes reduction of junction depth, punchthrough-prevention implants and threshold-adjust implants may overlap, thereby limiting their effectiveness. It may therefore be useful to have a method of adjusting the threshold voltage without changing the channel doping. The ability to select gate conductors from a variety of conductive materials, typically metals having a variety of work functions, may enable such a method of threshold voltage adjustment.

After completion of the n-channel and p-channel gate structures, masking layers are typically removed and circuit fabrication is continued. If source and drain regions were formed using the original gate structures, fabrication may be continued by, for example, forming contacts to the source, drain and gate.

In addition to the method described above, an integrated circuit having n-channel and p-channel transistors with separately optimized gate structures is contemplated herein. N-type and p-type active regions within a semiconductor substrate are separated by isolation regions. A first gate structure comprising a first gate dielectric and a first gate conductor is arranged over each p-type active region, and a second gate structure comprising a second gate dielectric and a second gate conductor is arranged over each n-type active region. The gate dielectric may comprise any suitable dielectric, such as oxide, nitride, oxynitride, or a high-permittivity material such as zirconium oxide. The gate conductor may comprise any suitable conductive material, such as doped polysilicon, silicide, metal or a metal nitride. The first gate structure, which is part of an n-channel transistor, has a different composition than the second gate structure, which is part of a p-channel transistor. The composition of the first gate structure is preferably optimized for n-channel transistor operation, while the composition of the second gate structure is optimized for p-channel transistor operation. The n-channel and p-channel transistors include source and drain regions within the semiconductor substrate, and may include dielectric spacers laterally adjacent sidewalls of the gate structures. Silicides formed at upper surfaces of the source, drain, and/or gate regions may also be included.

In one embodiment of the integrated circuit, the composition of the first gate structure differs from that of the second gate structure in that the first gate dielectric is thinner than the second gate dielectric. In this embodiment, the lateral length of the first gate structure is preferably smaller than that of the second gate structure. In this way, the n-channel transistor is scaled to a smaller feature size, while the p-channel transistor is made larger to accommodate rapid diffusion of boron. The second gate structure may include a diffusion barrier layer within either the second gate dielectric or second gate conductor. For example, a conductive metal nitride layer such as titanium nitride may form a lower portion of the gate conductor, to help retard boron diffusion between the channel and gate conductor of the p-channel transistor.

The first gate structure may also include a metal gate conductor, which may be combined with the thinner first gate dielectric and shorter gate length described above. In other embodiments, the first gate dielectric may comprise a high-permittivity, or "high-K" material, i.e. a material having a high dielectric constant. High-K dielectrics are often useful for devices in which the desired gate dielectric is very thin, because a high-K dielectric of a given thickness behaves electrically like a thinner lower-K dielectric. Use of a high-K dielectric may therefore mitigate reliability problems associated with very thin gate dielectrics, such as breakdown from structural defects like pinholes. In some embodiments of the integrated circuit, the conductive materials comprising the first and second gate conductors are such that the n-channel and p-channel transistor threshold voltages are of approximately equal magnitude.

BRIEF DESCRIPTION OF THE DRAWINGS

Other objects and advantages of the invention will become apparent upon reading the following detailed description and upon reference to the accompanying drawings in which.

Figure 1:
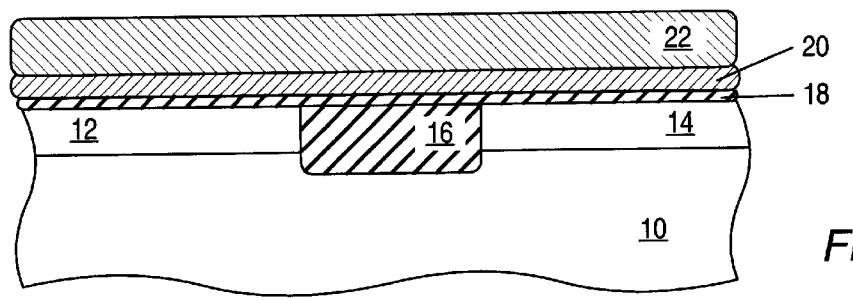
FIG. 1 is a partial cross-sectional view of a semiconductor topography including n-type and p-type active regions within a semiconductor substrate, over which a gate dielectric layer, a diffusion barrier, and a gate conductor layer are formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Turning to the drawings, FIG. 1 illustrates a partial cross-section of a semiconductor topography including semiconductor substrate 10 and a p-type active region 12 and n-type active region 14 formed within substrate 10. Active region 12 may be separated from active region 14 and other adjacent active regions by isolation regions 16. A gate dielectric layer 18 is formed over the upper surface of substrate 10. Conductive (or to be made conductive) layer 22 is formed above gate dielectric 18. In the embodiment of FIGS. 1–12, a conductive diffusion barrier layer 20 is formed between gate dielectric 18 and conductive layer 22.

Semiconductor substrate 10 is preferably monocrystalline silicon, and is doped either n-type or p-type. The background doping of substrate 10 is preferably relatively low, so that active regions 12 and 14 may be formed using low-to-medium doping levels. Substrate 10 may be, for example, an epitaxial silicon layer grown on a monocrystalline silicon substrate, or an epitaxial silicon layer grown over an insulating layer on a semiconductor substrate. Isolation regions 16 may be formed by various methods, including the formation of trenches which are subsequently filled with a deposited dielectric, or local oxidation of the substrate using silicon nitride to mask the active regions.

Gate dielectric 18 may be grown by heating substrate 10 to a temperature of greater than about 700° C. in an oxidizing ambient to grow silicon dioxide, a nitrogen-containing ambient to grow silicon nitride, or an ambient containing both oxygen and nitrogen to form an oxynitride or nitrided oxide. Nitride-containing dielectrics may be useful in applications for which a diffusion barrier is desirable, such as formation of p-channel transistors containing boron or use of diffusion-prone gate conductor materials such as copper. In other cases, silicon dioxide is often preferred because it is believed to form a superior interface with a silicon substrate. Other gate dielectrics may be used, including deposited silicon dioxide and silicon nitride, as well as nitrided silicon dioxide and silicon oxynitride. Because subsequent processing to form, for example, source and drain regions involves elevated temperatures, gate dielectric layer 18 should be formed from a material able to withstand such temperatures. Some dielectrics other than the silicon compounds described above, such as some metal-oxide-based high-K dielectrics, may exhibit undesirable diffusion when subjected to such elevated temperatures. Such dielectrics should not be used for gate dielectric 18, but may be used in refilling a trench to form a new gate structure, as described in more detail below (for example, in the description of FIG. 17).

Conductive layer 22 is preferably a polysilicon layer or any conductive (or to be rendered conductive) material capable of withstanding high temperature cycles. A polysilicon layer may be deposited using chemical vapor deposition (CVD) of silicon from, for example, a silane source. Such a CVD process may alternatively result in an amorphous silicon layer, particularly if low substrate temperatures are used. An amorphous silicon layer may be used for conductive layer 22, and other materials which can withstand subsequent processing (such as that needed to form source and drain regions) may also be used. Conductive diffusion barrier layer 20 is preferably formed from a metal nitride, such as titanium nitride or tantalum nitride.

Figure 2:
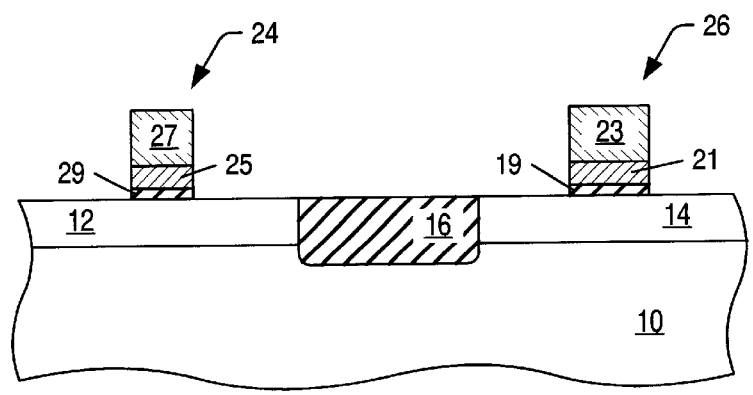
FIG. 2 is a partial cross-sectional view of the semiconductor topography wherein a first gate structure is patterned over the p-type active region and a second gate structure is patterned over the n-type active region, subsequent to the layer deposition of FIG. 1.

Gate structures are patterned from layers 18, 20, and 22, as shown in FIG. 2. Gate structure 24 is formed over p-type active region 12, and gate structure 26 is formed over n-type active region 14. In the embodiment of FIG. 2, gate structure 24 is patterned to have a shorter lateral length than gate structure 26. The n-channel transistor which may be formed using gate structure 24 therefore has a shorter channel than the p-channel transistor which may be formed using gate structure 26. This is in keeping with the limitations on feature size reduction in p-channel transistors discussed above. Alternatively, gate structure 24 may be longer than gate structure 26, or the structures may have the same length.

Gate structure 24 contains gate dielectric 29, conductive diffusion barrier 25, and gate conductor 27, while gate structure 26 contains gate dielectric 19, conductive diffusion barrier 21 and gate conductor 23. Portions of gate dielectric layer 18 not covered by gate conductors 27 and 23 are removed during the gate structure patterning process in the embodiment of FIG. 2. Alternatively, the entirety of gate dielectric 18 may be left in place for subsequent processing steps, as long as the portions external to the gate structures are removed before making contact to the source and drain regions. Because they are both patterned from the stack of layers 18, 20 and 22, gate structures 24 and 26 have the same composition. For example, the gate dielectrics, diffusion barriers, and gate conductors in each gate structure are formed from the same materials and have the same thicknesses.

Figure 3:
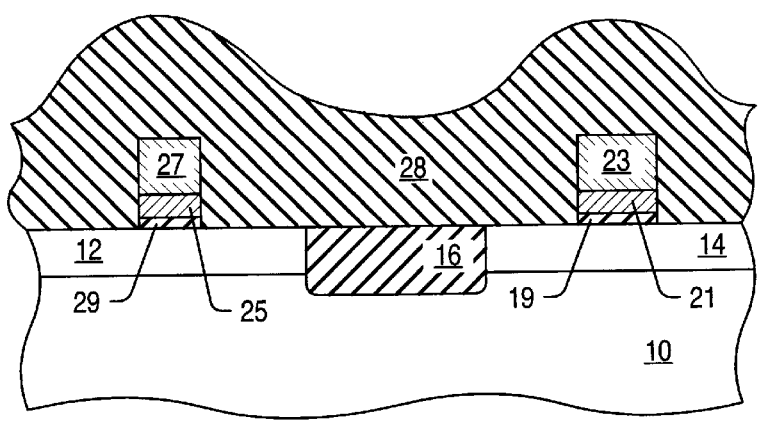
FIG. 3 is a partial cross-sectional view of the semiconductor topography wherein a dielectric layer is deposited over the gate structures and semiconductor substrate, subsequent to the gate structure formation of FIG. 2.

Conformal dielectric layer 28 is subsequently deposited over substrate 10 and gate structures 24 and 26, as shown in FIG. 3. As in the case of gate dielectric layer 18, dielectric layer 28 is formed from a dielectric which can withstand elevated temperatures. Furthermore, dielectric layer 28 is preferably formed from a different dielectric than gate dielectrics 29 and 19, so that one of these gate dielectrics may be subsequently removed without damage to the protective dielectrics which are formed from dielectric layer 28. For example, if gate dielectrics 29 and 19 are formed from oxide, dielectric layer 28 may be formed from silicon nitride or silicon oxynitride. Conformal dielectric layer 28 is at least as thick as gate structures 24 and 26, and is preferably deposited using a CVD technique. For example, if dielectric layer 28 is formed from oxide (gate dielectrics 29 and 29 would be formed from a different dielectric in this case), decomposition of tetraethyl orthosilicate (TEOS) may be performed in a low-pressure CVD (LPCVD) reactor at a substrate temperature in the range from about 400° C. to about 800° C. to produce a very conformal film. Other techniques which may be used to deposit silicon dioxide for dielectric layer 28 include atmospheric-pressure CVD (APCVD) and plasma-enhanced CVD (PECVD) using TEOS or silane sources.

Figure 4:
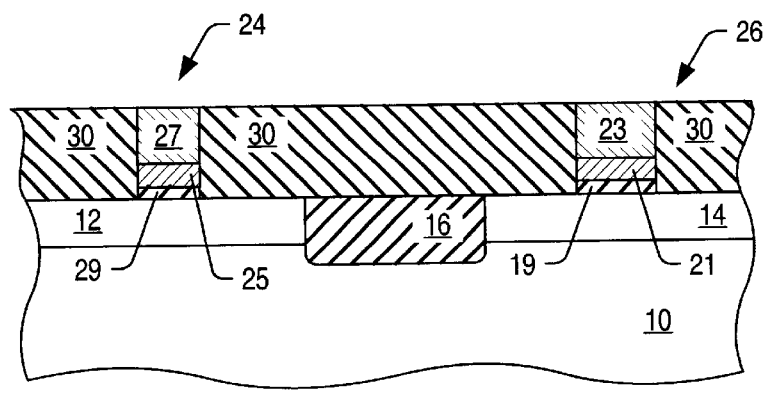
FIG. 4 is a partial cross-sectional view of the semiconductor topography wherein portions of the dielectric layer are removed such that protective dielectrics having upper surfaces at the same level as the upper surfaces of the gate structures are formed, subsequent to the deposition of FIG. 3.
Figure 5:
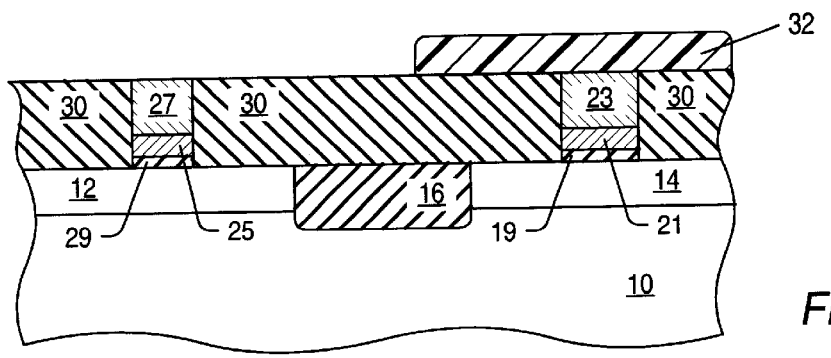
FIG. 5 is a partial cross-sectional view of the semiconductor topography wherein a masking layer is patterned to cover the second gate structure, subsequent to the dielectric portion removal of FIG. 4.

Portions of dielectric layer 28 which extend above the upper surfaces of gate structures 24 and 26 are subsequently removed, as shown in FIG. 4. The removal process is preferably performed using chemical-mechanical polishing (CMP), in which an abrasive polishing pad is used with a polishing fluid to polish away elevated portions of a semiconductor topography. The remaining portions of dielectric layer 28 form protective dielectrics 30, which have upper surfaces at the same level as the upper surfaces of gate structures 24 and 26. In this manner, all upper surfaces of the semiconductor topography, except for the upper surfaces of gate conductors 27 and 23, are protected by dielectrics 30. One of the gate structures is subsequently covered with a masking layer, as shown in FIG. 5. In the embodiment of FIG. 5, masking layer 32 is patterned to cover gate structure 26. Any other gate structures formed over n-type active regions are also covered by masking layer 32, such that only gate structures formed over p-type active regions are exposed. Masking layer 32 is preferably formed from photoresist, but other materials which may be patterned to cover the appropriate gate conductors and which can withstand subsequent etching processes may also be suitable.

Figure 6:
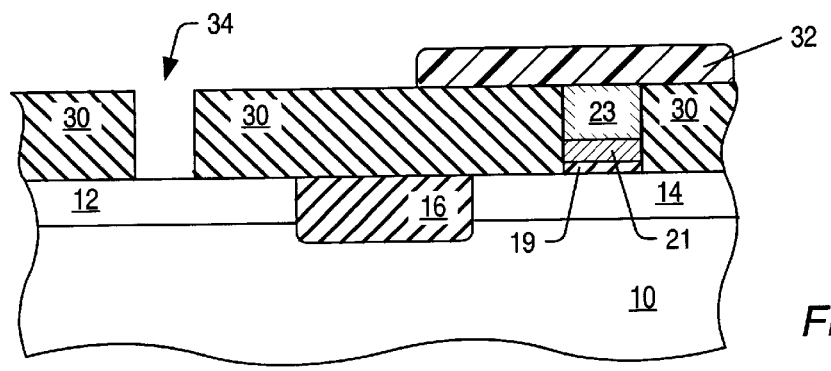
FIG. 6 is a partial cross-sectional view of the semiconductor topography wherein the first gate structure is removed such that a trench is formed, subsequent to the masking layer formation of FIG. 5.

Gate structure 24 is subsequently removed, as shown in FIG. 6. This removal is preferably done using a dry etching process which is selective to the materials forming gate conductor 27, diffusion barrier 25, and gate dielectric 29 over the materials of protective dielectrics 30 and p-type active region 12. Other techniques, such as a wet etch process with the appropriate selectivity, may also be suitable. Removal of gate structure 24 forms trench 34 which is bounded by active region 12 and sidewalls of dielectrics 30.

Figure 7:
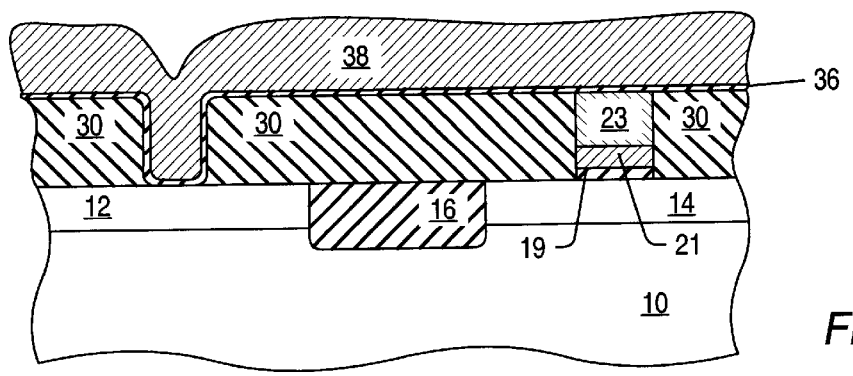
FIG. 7 is a partial cross-sectional view of the semiconductor topography wherein a dielectric material layer and a conductive material layer are deposited to fill the trench, subsequent to the gate structure removal of FIG. 6.

Turning now to FIG. 7, masking layer 32 is removed, and dielectric material 36 and conductive material 38 are deposited over active region 12 and protective dielectrics 30, such that trench 34 is filled. In the embodiment of FIG. 7, source and drain region formation, with the associated elevated temperatures, is not performed until after the trench filling shown in FIG. 7. Dielectric material 36 and conductive material 38 should therefore be able to withstand high-temperature processing. Dielectric material 36 may therefore be similar in chemical composition to gate dielectric layer 18 of FIG. 1. Dielectric layer 36 is thinner than dielectric layer 18 in the embodiment of FIG. 7. The resulting thinner gate dielectric is in keeping with the shorter channel length associated with the transistor to be formed over p-type active region 12, as compared to the transistor which may be formed over n-type active region 14 using gate structure 26. The removal of gate structure 24 therefore allows the gate structure of the n-channel transistor formed over active region 12 to be optimized separately from that of the p-channel transistor formed over active region 14.

In the embodiment of FIG. 7, a conformal deposition technique such as CVD is used to deposit dielectric material 36. This results in deposition of dielectric layer 36 along the sidewalls as well as the bottom of trench 34. The nominal gate length of the resulting transistor is therefore reduced by twice the thickness of dielectric layer 36 along the trench sidewalls. Because gate dielectric thicknesses of high-performance transistors are typically less than 100 angstroms, the gate length reduction is believed to be small. The small amount of diffusion of source/drain regions into the channel in n-channel transistors is believed to be sufficient to ensure that the channel of the final transistor is in contact with the source and drain regions. Alternatively, deposition of dielectric material 36 onto the trench sidewalls may be avoided by using a nonconformal deposition technique such as sputtering.

Figure 8:
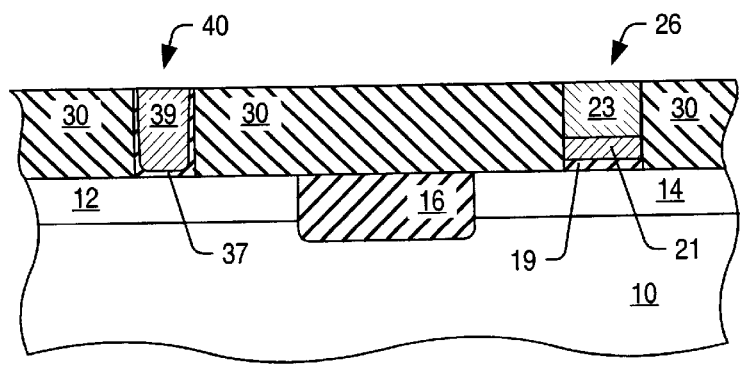
FIG. 8 is a partial cross-sectional view of the semiconductor topography wherein portions of the dielectric and conductive material layers external to the trench are removed such that a new gate structure is formed, subsequent to the deposition of FIG. 7.

Conductive material 38 may be polysilicon, or another conductive material which can withstand elevated processing temperatures. For example, high-temperature metals such as tungsten or molybdenum may be suitable for conductive material 38. Conductive layer 38 may also include a diffusion barrier and/or adhesion promoting layer as a lower portion of material 38, adjacent to dielectric 36. Such a diffusion barrier or adhesion layer would have a composition similar to that of diffusion barrier 21, and could be formed from, for example, a refractory metal such as titanium or a metal nitride such as titanium nitride or tantalum nitride. Portions of dielectric material 36 and conductive material 38 which extend above the upper surfaces of dielectric regions 30 are subsequently removed, as shown in FIG. 8. The removal is preferably done using CMP, and the remaining portion of dielectric material 36 and conductive material 38 form new gate structure 40. Gate structure 40 includes gate dielectric 37 and gate conductor 39.

Figure 9:
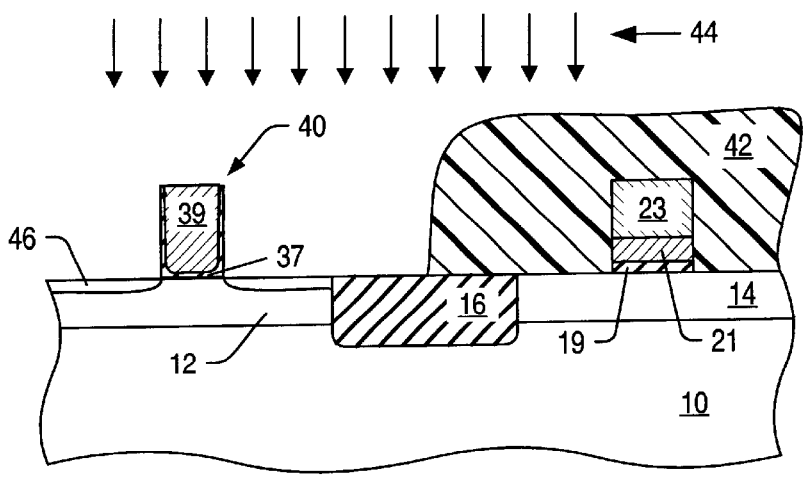
FIG. 9 is a partial cross-sectional view of the semiconductor topography wherein the protective dielectrics are removed and the n-type active region is covered by a masking layer during ion implantation into the p-type active region to form a shallow impurity distribution, subsequent to the new gate structure formation of FIG. 8.
Figure 10:
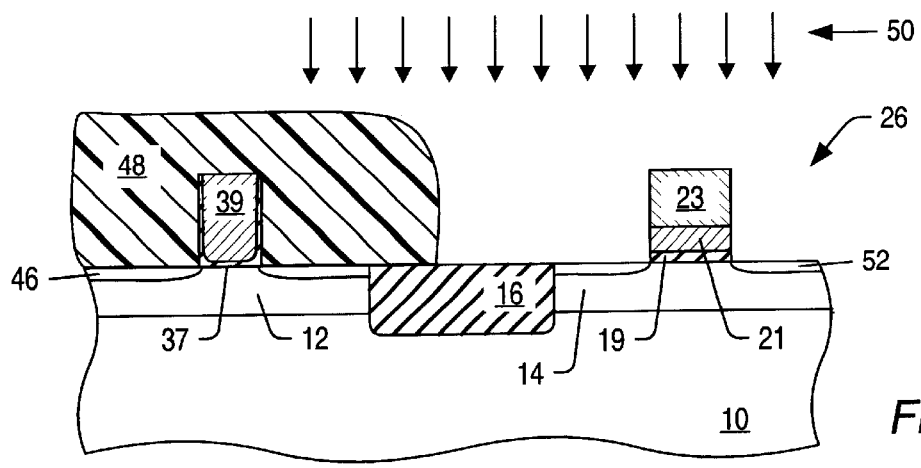
FIG. 10 is a partial cross-sectional view of the semiconductor topography wherein the p-type active region is covered by a masking layer during ion implantation into the n-type active region, subsequent to the shallow distribution formation of FIG. 9.

To continue formation of transistors on active regions 12 and 14, source and drain regions must be formed. Because the source and drain regions are doped with opposite impurity type to form n-channel transistors than to form p-channel transistors, transistors of one type must be protected during source and drain formation for transistors of the other type. For example, the n-type active regions may be covered with a masking layer 42, as shown in FIG. 9. Masking layer 42 protects the transistor to be formed on n-type active region 14 while shallow source and drain distributions 46 are introduced using impurity introduction 44. Impurity introduction 44, preferably an ion implantation process, introduces n-type impurities into p-type active region 12, self-aligned to new gate structure 40. When silicon is used for substrate 10, suitable n-type impurities include arsenic and phosphorus. Masking layer 42 is preferably a photoresist layer, but as in the case of masking layer 32 of FIG. 5, other materials may also be suitable. After introduction of shallow source/drain impurity distributions 46, masking layer 42 is removed, and masking layer 48 is formed over the p-type active regions, as shown in FIG. 10. Impurity introduction 50 may then be used to form shallow p-type source/drain distributions 52, self-aligned to gate structure 26. Distributions 52 are preferably formed by ion implantation of boron, but other p-type impurities and introduction methods may also be suitable. If distributions 46 and 52 are introduced by ion implantation, a subsequent anneal is performed in order to activate the impurities and repair damage to active regions 12 and 14 of substrate 10.

Figure 11:
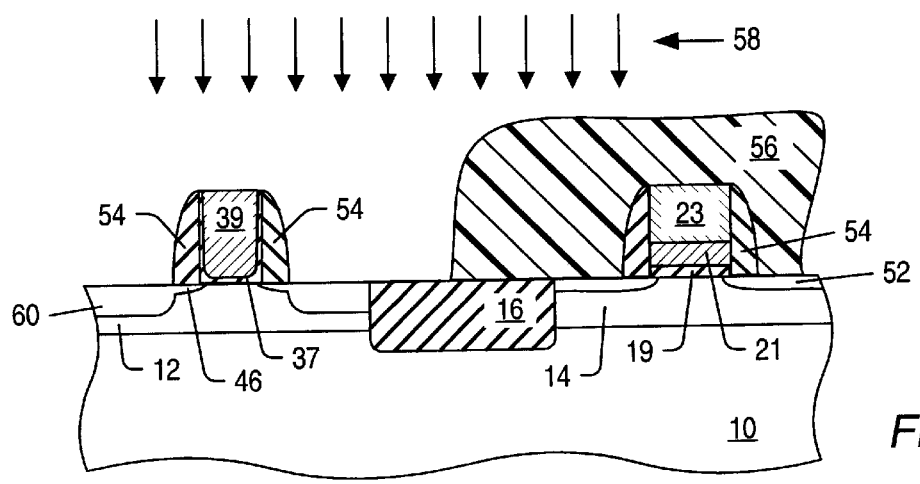
FIG. 11 is a partial cross-sectional view of the semiconductor topography wherein dielectric sidewall spacers are formed and the n-type active region is covered by a masking layer during ion implantation into the p-type active region to form a deep impurity distribution, subsequent to the shallow distribution formation of FIG. 10.

After formation of distributions 52, masking layer 48 is removed and dielectric spacers 54 may subsequently be formed on sidewalls of gate structures 40 and 26, as shown in FIG. 11. Spacers 54 are preferably formed by depositing a conformal dielectric layer over substrate 10 and gate structures 40 and 26. The conformal dielectric is then anisotropically etched such that horizontal surfaces are etched faster than vertical surfaces, leaving behind spacers 54. Formation of spacers 54 may be advantageous for reasons including the ability to form shallow, relatively lightly-doped regions under the spacers which may lower the maximum electric field developed at the drain end of the channel. This lowered electric field may reduce the severity of hot-carrier effects such as avalanche breakdown at the drain/substrate junction and injection of carriers into the gate dielectric. Spacers 54 may also be advantageous by providing isolation between the source/drain and gate regions so that a salicide process may be performed. The spacers are typically formed from oxide, but may also be formed from other dielectrics which can withstand high temperatures, such as silicon nitride or silicon oxynitride.

Figure 12:
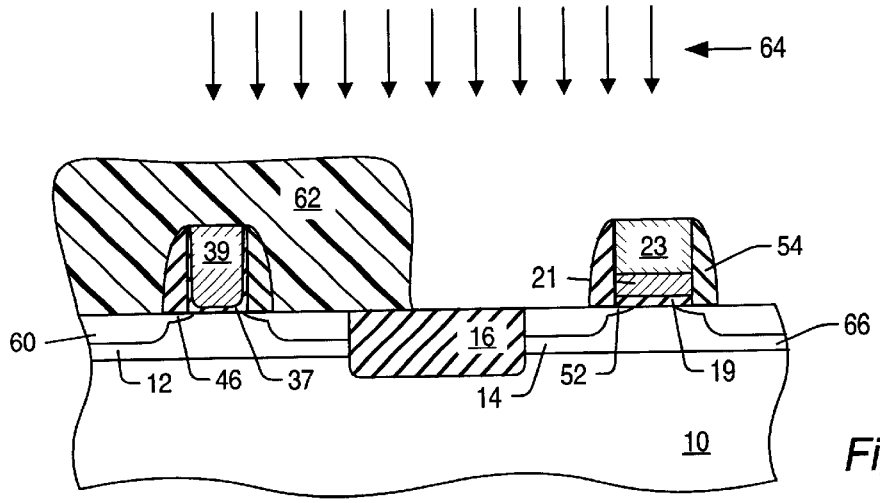
FIG. 12 is a partial cross-sectional view of the semiconductor topography wherein the p-type active region is covered by a masking layer during ion implantation into the n-type active region to form a deep impurity distribution, subsequent to the deep impurity distribution formation of FIG. 11.

To facilitate making contact to the source/drain regions, deeper, more heavily doped impurity distributions are introduced, self-aligned to exposed lateral surfaces of spacers 54. As in the case of the shallow impurity distribution introduction of FIGS. 9 and 10, the n-type active regions are masked for the introduction of n-type impurities for the n-channel transistors (as shown in FIG. 11), and the p-type active regions are masked for the corresponding introduction of p-type impurities for the p-channel transistors. Impurity introductions 58 and 64 are preferably ion implantations of n-type and p-type impurities, respectively. Masking layers 56 and 62 of FIGS. 11 and 12 are similar to masking layers 42 and 48 of FIGS. 9 and 10. The lateral positions of source/drain impurity distributions 46, 60, 52 and 66 in the integrated circuit of FIG. 12 illustrate the enhanced impurity diffusion, and resultant shorter channel length, exhibited by p-channel transistors when boron is used as the p-type dopant. After formation of deep p-type distributions 66 as shown in FIG. 12, masking layer 62 may be removed, and circuit fabrication continued. For example, a salicide process may be used to form silicide regions on upper surfaces of gate conductors 39 and 23 and deep source/drain regions 60 and 66. Dielectric and metal deposition and patterning may be carried out to form contacts to the transistors and interconnects for the circuit.

In the embodiment of the method shown in FIGS. 1–12, original gate structures 24 and 26 have a composition optimized for p-channel transistor performance. For example, original gate dielectrics 29 and 19 are thicker than gate dielectric 37 used in new gate structure 40 for the final n-channel transistor. Furthermore, diffusion barrier 21 is believed to be useful in limiting boron diffusion across the gate of the p-channel transistor. N-type active region 14, in which the p-channel transistor is formed, is therefore protected by a masking layer while original gate structure 24 over p-type active region 12 is removed and replaced with new gate structure 40. Gate structure 40 is optimized for n-channel transistor operation, in that it includes thinner gate dielectric 37. In other embodiments of the method, however, the original gate structures could be optimized for n-channel performance, and the gate structure for the p-channel transistor could be removed and replaced with a new gate structure. Similarly, the order in which the doping steps of FIGS. 9 and 10 are performed could be reversed; i.e., the p-type shallow distribution formation of FIG. 10 could be done before the n-type shallow distribution formation of FIG. 9. The same is true for the deep distribution formation of FIGS. 11 and 12. Diffusion barrier layer 20 and/or spacers 54 may be omitted in some embodiments.

Figure 13:
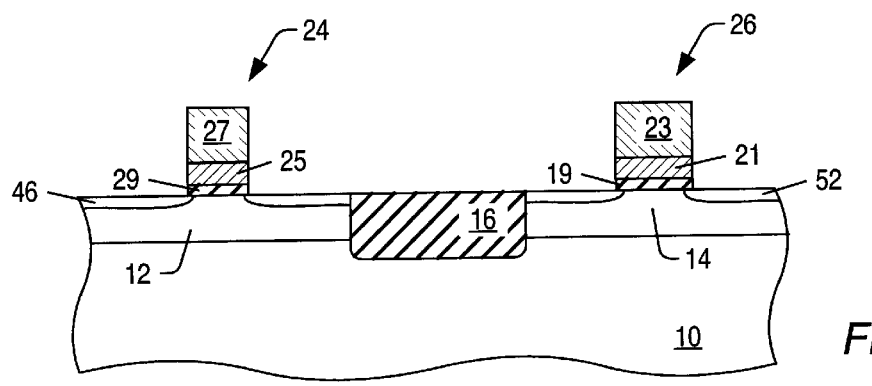
FIG. 13 is a partial cross-sectional view of the semiconductor topography according to an alternative embodiment, wherein shallow source and drain distributions are formed using the first and second gate structures in the manner of FIGS. 9–10, subsequent to the gate structure formation of FIG. 2.
Figure 14:
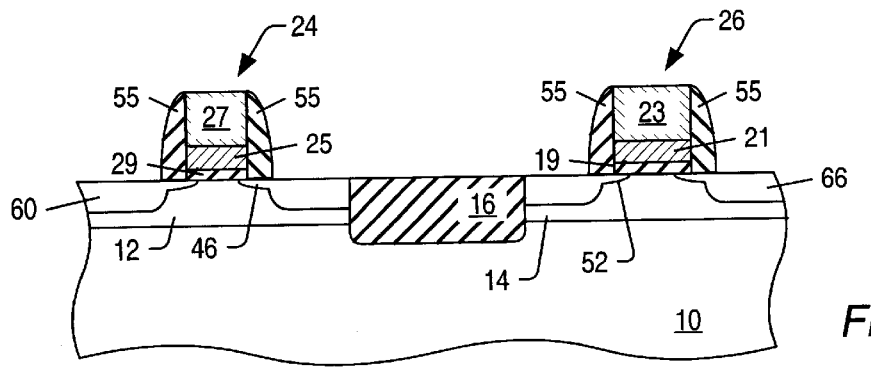
FIG. 14 is a partial cross-sectional view of the semiconductor topography wherein sidewall spacers are formed on the first and second gate structures and deep source and drain distributions are introduced in the manner of FIGS. 11–12, subsequent to the shallow distribution formation of FIG. 13.

Turning now to FIG. 13, a partial cross-sectional of a semiconductor topography according to an alternative embodiment of the method is shown. In the embodiment of FIGS. 13–20, source and drain regions are formed using original gate structures 24 and 26 before formation of protective dielectrics. Gate structures 24 and 26 of FIG. 13 are formed above active regions 12 and 14, respectively, as shown in FIGS. 1 and 2. N-type shallow source/drain regions 46 and p-type shallow source/drain regions 52 of FIG. 13 are formed in a manner similar to that shown in FIGS. 9 and 10. Dielectric spacers 55, deep n-type source/drain distributions 60, and deep p-type source/drain distributions 66, shown in FIG. 14, are formed in a manner similar to that of FIGS. 11 and 12. Dielectric spacers 55 of FIG. 14 differ from dielectric spacers 54 of FIG. 11 in one respect. Spacers 55 are formed from a different dielectric than that used to form gate dielectrics 29 and 19, so that one or both of these gate dielectrics may be subsequently removed without damaging spacers 55. Although not shown in FIG. 14, a salicide process may also be used after formation of deep source/drain distributions 60 and 66 to form silicides on upper surfaces of these regions as well as on upper surfaces of gate conductors 27 and 23.

Figure 15:
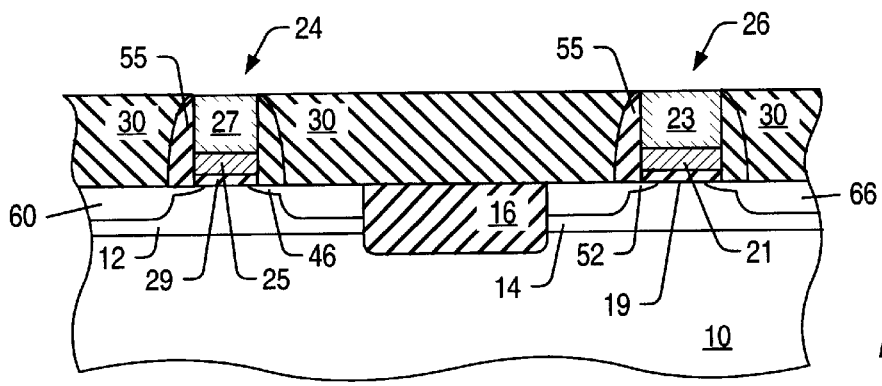
FIG. 15 is a partial cross-sectional view of the semiconductor topography wherein protective dielectrics are formed in the manner of FIGS. 3–4, subsequent to the deep distribution formation of FIG. 14.
Figure 16:
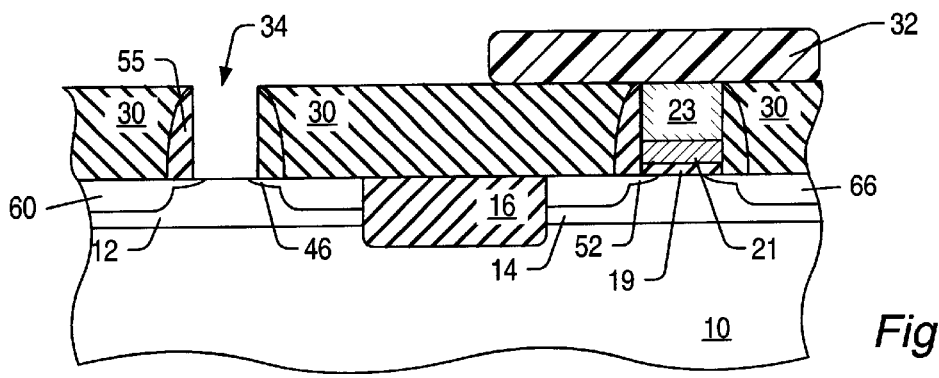
FIG. 16 is a partial cross-sectional view of the semiconductor topography wherein a masking layer is patterned to cover the second gate structure and the first gate structure is removed, subsequent to the protective dielectric formation of FIG. 15.

Protective dielectrics 30 are subsequently formed over substrate 10, as shown in FIG. 15. Protective dielectrics 30 are formed in the manner shown in FIGS. 3 and 4, and have upper surfaces at the same level as the upper surfaces of gate structures 24 and 26. Turning to FIG. 16, gate structure 36 is covered by masking layer 32, along with any other gate structures used in p-channel transistors, and uncovered gate structure 24 is removed to form trench 34. Other gate structures used in n-channel transistors are also left uncovered by masking layer 32, and therefore are removed along with gate structure 24. The masking and removal of FIG. 16 are done in a similar manner as shown in FIGS. 5 and 6.

Figure 17:
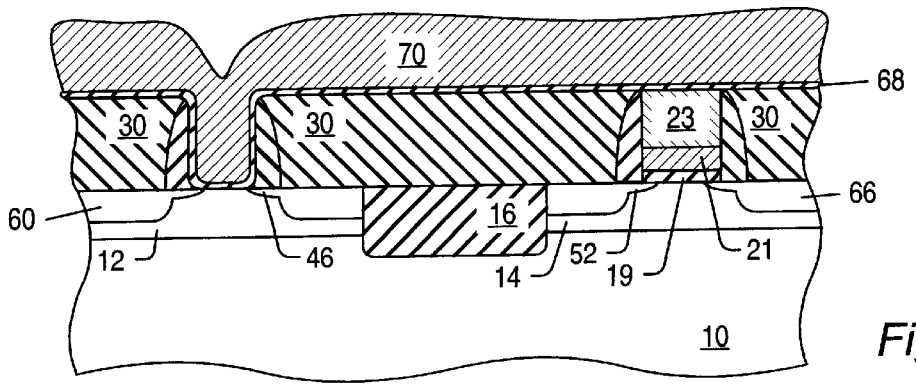
FIG. 17 is a partial cross-sectional view of the semiconductor topography wherein a dielectric layer and a conductive layer are deposited within the trench, subsequent to the first gate structure removal of FIG. 16.

After removal of masking layer 32, dielectric layer 68 and conductive layer 70 are deposited over upper surfaces of active region 12, dielectrics 30 and gate structure 26, as shown in FIG. 17. Dielectric layer 68 and conductive layer 70 of FIG. 17 differ from dielectric layer 36 and conductive layer 38, respectively, of FIG. 7 in that layers 68 and 70 may not need to be able to withstand elevated temperatures. Because source/drain formation and silicide formation (if used) are done using original gate structures 24 and 26, processing subsequent to deposition of layers 68 and 70 may be limited to relatively low-temperature interconnect formation processes. Lower-temperature materials may therefore be suitable for dielectric layer 68 and conductive layer 70.

For example, a high-K dielectric may be used for dielectric layer 68. High-K dielectrics may allow a relatively thick gate dielectric to provide the electrical performance of an extremely thin gate oxide, while avoiding the reliability problems associated with very thin films. Oxide has a dielectric constant K of approximately 4. Silicon nitride may be considered a high-K material, having a somewhat higher dielectric constant of between about 6 and 9, depending on formation conditions. Significantly higher K values of, for example, 20 or more may be obtained with various transition metal oxides, including tantalum oxide ($Ta_2O_5$), barium strontium titanate ("BST"), lead zirconate titanate ("PZT"), and zirconium oxide. By allowing elevated temperatures to be avoided after deposition of layers 68 and 70, the embodiment of FIGS. 13–20 may allow use of high-K materials such as these without problematic diffusion of metal and oxygen atoms into the transistor gate conductor or channel. In the embodiment of FIG. 17, a conformal deposition technique such as CVD is used to deposit dielectric layer 68, so that the layer is formed on sidewalls of trench 34 as well as on the bottom of the trench. As in the case of dielectric layer 36 of FIG. 7, deposition of layer 68 on the trench sidewalls may be avoided if a nonconformal deposition technique such as sputtering is used.

As noted above, a low-temperature material may be suitable for conductive layer 70 of FIG. 17, in addition to the materials used for conductive layer 38 of FIG. 7. For example, low-resistivity metals such as copper or aluminum, or alloys of copper or aluminum, may be used. Conductive layer 70 may also include a conductive diffusion barrier and/or adhesion layer formed at the bottom of conductive layer 70, adjacent to dielectric material 68. Suitable materials for such a diffusion barrier or adhesion layer may include refractory metals such as titanium or tantalum, and metal nitrides such as titanium nitride and tantalum nitride. If copper is used for conductive layer 70, copper deposition may include formation of a thin seed layer of copper by physical vapor deposition (PVD) techniques such as evaporation or sputtering, or by CVD. Deposition of thicker copper layers may include CVD, PVD and plating techniques. If a high-K metal oxide is used for dielectric layer 68, an oxidation-resistant metal such as ruthenium, platinum, or iridium (or an alloy of such a metal) may be suitable for conductive layer 70.

Figure 18:
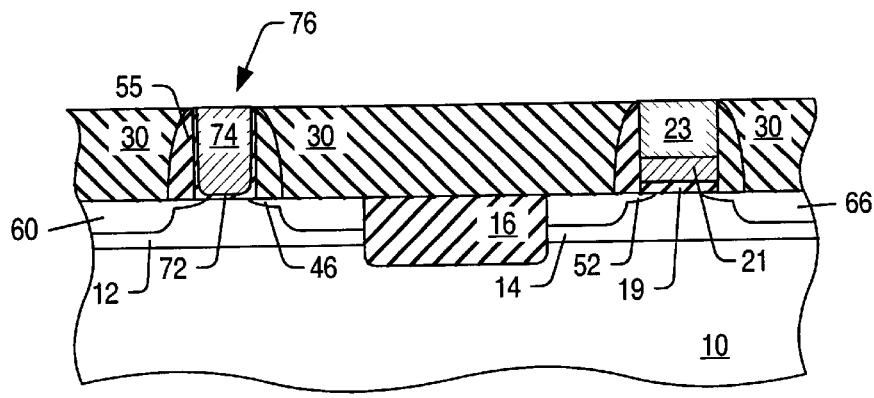
FIG. 18 is a partial cross-sectional view of the semiconductor topography wherein portions of the dielectric layer and conductive layer external to the trench are removed such that a new gate structure is formed, subsequent to the layer depositions of FIG. 17.

Portions of dielectric layer 68 and conductive layer 70 which extend above the upper surfaces of dielectric regions 30 are subsequently removed, as shown in FIG. 18. This removal, preferably done by CMP, creates a new gate structure 76 for the n-channel transistor, including gate dielectric 72 and gate conductor 74. The integrated circuit shown in FIG. 18 therefore includes an n-channel transistor having a gate structure optimized for n-channel transistor operation and a p-channel transistor having a gate structure optimized for p-channel transistor operation. The method recited herein provides for formation of these separately optimized gate structures for all of the transistors in an integrated circuit. The n-channel transistor formed within and over active region 12 may include a thinner gate dielectric, or one made for a high-K material. Gate conductor 74 may be formed from a low-resistance metal, so that the increased resistivity associated with suicides formed on short polysilicon gate conductors may be avoided. The p-channel transistor of the circuit of FIG. 18 is similar to that of FIG. 12, in that a thicker gate dielectric may be used, and a diffusion barrier may be employed to prevent boron diffusion across the gate dielectric. Openings in dielectric regions 30 may subsequently be formed by lithography and etching techniques so that contact may be made to deep source/drain distributions 60 and 66. Circuit fabrication may then be continued using deposition and patterning of dielectrics and conductors in order to form contacts and interconnects.

Figure 19:
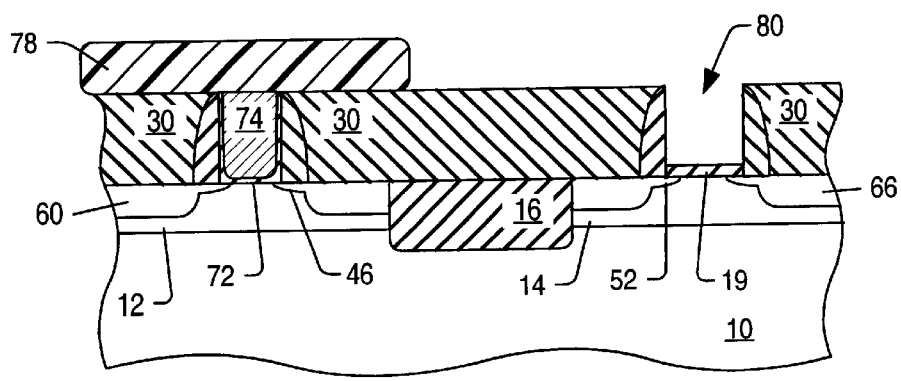
FIG. 19 is a partial cross-sectional view of a semiconductor topography wherein a masking layer is patterned to cover the first gate structure and the second gate structure is removed to form a trench, subsequent to the new gate structure formation of FIG. 18.
Figure 20:
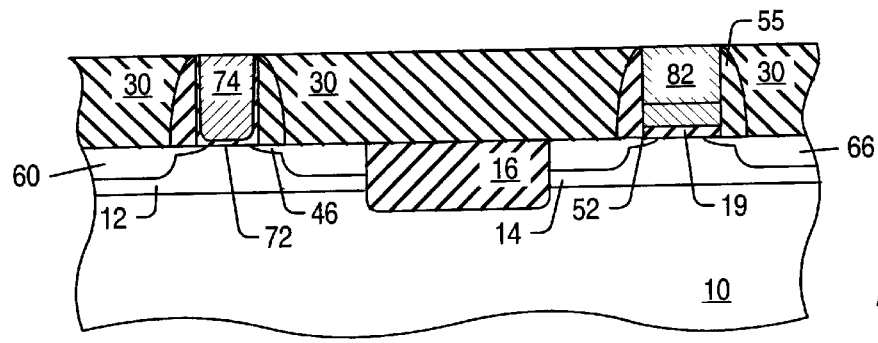
FIG. 20 is a partial cross-sectional view of the semiconductor topography wherein the masking layer is removed and a new second gate structure is formed within the trench, subsequent to the second gate structure removal of FIG. 19.

If a gate containing a low-temperature material, such as a low-resistance metal, is desirable for the p-channel transistors, the n-channel gate structures, including gate structure 76, may be covered with masking layer 78, as shown in FIG. 19. The desired portions of the p-channel gate structures, such as gate structure 26, may then be removed. In the embodiment of FIG. 19, gate conductor 23 and diffusion barrier 21 are removed, preferably using a dry etching process, to form trench 80. A new conductive gate 82 is then formed within trench 80, as shown in FIG. 20. Conductive gate 82 is formed from a conductive material similar to conductive material 70 of FIG. 17, by a method similar to that of FIGS. 17 and 18, or FIGS. 7 and 8. Although diffusion barrier 21 is not present in the final p-channel gate structure shown in FIG. 20, the diffusion barrier may still have served a useful purpose during the fabrication process, by protecting the channel in active region 14 from diffusion of boron from original gate conductor 23.

The method recited herein is believed to provide a large amount of flexibility in separate optimization of gate structures in n-channel and p-channel transistors. This optimization may improve circuit performance by allowing aggressive scaling of n-channel transistors without causing excess boron diffusion in p-channel transistors. Furthermore, the method may provide additional flexibility in tailoring threshold voltages of n-channel and p-channel transistors. It is generally desirable in CMOS circuits that the n-channel and p-channel transistors have threshold voltages with approximately equal magnitudes. The ability to choose from a wide range of gate conductor materials may allow the work functions of the gate materials to be chosen such that this approximately equal magnitude is achieved. This use of gate conductor materials to adjust threshold voltages may reduce constraints on the doping of the channel region of the transistor, thereby allowing more effective adjustment of this doping to minimize short-channel effects such as punch-through. As noted in describing the embodiment of FIGS. 1–12, the method could be performed in a manner similar to that shown in FIGS. 13–20, but using original gate structures optimized for n-channel performance. Because the original gate structures are exposed to elevated temperatures in the embodiment of FIGS. 13–20, however, some boron diffusion into the channel of the p-channel transistors may occur if thin gate dielectrics are used in the original gate structure.

It will be appreciated to those skilled in the art having the benefit of this disclosure that this invention is believed to provide a method for forming integrated circuits having separately optimized gate structures for n-channel and p-channel transistors. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit, comprising:
an n-type active region of a semiconductor substrate separated from a p-type active region of said substrate by an isolation region;
an n-channel transistor comprising a first gate structure arranged above said p-type active region, wherein said first gate structure comprises a first gate conductor in direct contact with a first gate dielectric, and wherein said first rate conductor comprises a low-temperature metal; and
a p-channel transistor comprising a second gate structure arranged above said n-type active region, wherein said second gate structure comprises a second gate conductor over a second gate dielectric, and wherein said second gate conductor comprises a low-temperature metal, and wherein a composition of said second gate structure is different than a composition of said first gate structure.

2. The integrated circuit as recited in claim 1, wherein a dielectric constant of said first gate dielectric is larger than a dielectric constant of said second gate dielectric.

3. The integrated circuit as recited in claim 1, wherein said second gate conductor comprises a diffusion barrier layer.

4. The integrated circuit as recited in claim 3, wherein said diffusion barrier layer comprises a metal nitride.

5. The integrated circuit as recited in claim 4, wherein said metal nitride comprises titanium nitride.

6. The integrated circuit as recited in claim 1, wherein a thickness of said first gate dielectric is smaller than a thickness of said second gate dielectric.

7. The integrated circuit as recited in claim 1, wherein a work function of said first gate conductor is different than a work function of said second gate conductor, such that a magnitude of a threshold voltage of said p-channel transistor is approximately equal to a magnitude of a threshold voltage of said n-channel transistor.

8. The integrated circuit as recited in claim 1, wherein said low-temperature metal comprises aluminum, an aluminum alloy, copper, or a copper alloy.

9. The integrated circuit as recited in claim 1, wherein a lateral length of said first gate structure is smaller than a lateral length of said second gate structure.

10. An integrated circuit, comprising:
an n-type active region of a semiconductor substrate separated from a p-type active region of said substrate by an isolation region;
an n-channel transistor comprising a first gate structure arranged above said p-type active region, wherein said first gate structure comprises a first gate conductor over a first gate dielectric; and
a p-channel transistor comprising a second gate structure arranged above said n-type active region, wherein said second gate structure comprises a second gate conductor over a second gate dielectric, and wherein said second gate conductor comprises a diffusion barrier layer interposed between said second gate conductor and said second gate dielectric, and wherein a composition of said second gate structure is different than a composition of said first gate structure, and wherein a lateral length of said first gate structure is smaller than a lateral length of said second gate structure.

11. The integrated circuit as recited in claim 10, wherein a work function of said first gate conductor is different than a work function of said second gate conductor, such that a magnitude of a threshold voltage of said p-channel transistor is approximately equal to a magnitude of a threshold voltage of said n-channel transistor.

12. The integrated circuit as recited in claim 10, wherein a dielectric constant of said first gate dielectric is larger than a dielectric constant of said second gate dielectric.

13. The integrated circuit as recited in claim 10, wherein said first and said second gate conductors consist essentially of metal.

14. An integrated circuit, comprising:
an n-type active region of a semiconductor substrate separated from a p-type active region of said substrate by an isolation region;
an n-channel transistor comprising a first gate structure arranged above said p-type active region, wherein said first gate conductor comprises a first gate conductor over a first gate dielectric; and
a p-channel transistor comprising a second gate structure arranged above said n-type active region, wherein second gate structure comprises a second gate conductor over a second gate dielectric, and wherein a dielectric constant of said second gate dielectric is smaller than a dielectric constant of said first gate dielectric, and wherein a composition of said second gate structure is different than a composition of said first gate structure.

15. The integrated circuit as recited in claim 14, wherein a work function of said first gate conductor is different than a work function of said second gate conductor, such that a magnitude of a threshold voltage of said p-channel transistor is approximately equal to a magnitude of a threshold voltage of said n-channel transistor.

16. The integrated circuit as recited in claim 14, wherein said first and said second gate conductors consist essentially of metal.

17. The integrated circuit as recited in claim 14, wherein said second gate conductor comprises a diffusion barrier layer.

18. The integrated circuit as recited in claim 14, wherein a lateral length of said first gate structure is smaller than a lateral length of said second gate structure.

* * * * *